(12) United States Patent
Cobleigh

(10) Patent No.: US 8,577,926 B1
(45) Date of Patent: Nov. 5, 2013

(54) AUTOMATIC PROPAGATION OF CHANGES IN A REFERENCED ENTITY

(75) Inventor: Jamieson M. Cobleigh, Ashland, MA (US)

(73) Assignee: The Mathworks, Inc., Natick, MA (US)

( * ) Notice: Subject to any disclaimer, the term of this patent is extended or adjusted under 35 U.S.C. 154(b) by 471 days.

(21) Appl. No.: 12/547,795

(22) Filed: Aug. 26, 2009

(51) Int. Cl.
    *G06F 17/30* (2006.01)

(52) U.S. Cl.
    USPC .......................................... 707/803

(58) Field of Classification Search
    USPC ................... 707/769, 737, 802, 803
    See application file for complete search history.

(56) References Cited

U.S. PATENT DOCUMENTS

| | | | |
|---|---|---|---|
| 2003/0005408 A1* | 1/2003 | Tumati | 717/110 |
| 2006/0129976 A1* | 6/2006 | Brand et al. | 717/109 |
| 2006/0271914 A1* | 11/2006 | Gopal et al. | 717/122 |
| 2007/0294074 A1* | 12/2007 | Ciolfi | 703/21 |
| 2010/0211662 A1* | 8/2010 | Glendinning et al. | 709/223 |

OTHER PUBLICATIONS

Co-pending U.S. Appl. No. 12/404,106, entitled "System and Methods for Graphical Model Environment Routing", by Krishna Balasubranabian, filed Mar. 13, 2009, 48 pages.

* cited by examiner

*Primary Examiner* — Christyann Pulliam
*Assistant Examiner* — Fariborz Khoshnoodi
(74) *Attorney, Agent, or Firm* — Harrity & Harrity, LLP

(57) ABSTRACT

In an embodiment, a technique for changing a parent model based on changes made to a referenced model. The technique may include receiving one or more changes for the referenced model. The referenced model may be changed based on the received one or more changes. Change information about the one or more changes to the referenced model is maintained. A reference to the referenced model from the parent model is processed. Processing may include changing the parent model based on the maintained change information for the referenced model.

22 Claims, 14 Drawing Sheets

610

```
0611: BEGIN_VERSION_INFO
0612: VERSION=0
0613: ADDED IN1
0614: ADDED IN2
0615: ADDED GAIN_1
0616: ADDED GAIN_2
0617: ADDED OUT1
0618: ADDED OUT2
0619: CONNECTED IN1 TO INPUT OF GAIN_1
0620: CONNECTED OUT1 TO OUTPUT OF GAIN_1
0621: CONNECTED IN2 TO INPUT OF GAIN_2
0622: CONNECTED OUT2 TO OUTPUT OF GAIN_2
0623: SET GAIN PARAMETER OF GAIN_1 TO 2
0624: SET GAIN PARAMETER OF GAIN_2 TO 5
0625: END_VERSION_INFO

0626: BEGIN_VERSION_INFO
0627: VERSION=1
0628: REMOVED IN1
0629: REMOVED GAIN_1
0630: REMOVED OUT1
0631: REMOVED CONNECTION OF IN1 TO INPUT OF GAIN_1
0632: REMOVED CONNECTION OF OUT1 TO OUTPUT OF GAIN_1
0633: END_VERSION_INFO
```

FIG. 6A

```
0651: BEGIN_VERSION_INFO
0652: VERSION=0
0653: ADDED CG_1
0654: ADDED CG_2
0655: ADDED REFERENCED MODEL
0656: ADDED DISP_1
0657: ADDED DISP_2
0658: CONNECTED CG_1 TO REFERENCED MODEL IN1
0659: CONNECTED DISP_1 TO REFERENCED MODEL OUT1
0660: CONNECTED CG_2 TO REFERENCED MODEL IN2
0661: CONNECTED DISP_2 TO REFERENCED MODEL OUT2
0662: LAST KNOWN VERSION OF REFERENCED MODEL=0
0663: END_VERSION_INFO

0664: BEGIN_VERSION_INFO
0665: VERSION=1
0666: REMOVED CONNECTION OF CG_1 TO REFERENCED MODEL IN1
0667: REMOVED CONNECTION OF DISP_1 TO REFERENCED MODEL OUT1
0668: LAST KNOWN VERSION OF REFERENCED MODEL=1
0669: END_VERSION_INFO
```

```
0811: BEGIN_SCRIPT ADD_GAIN_1
0812: ADD GAIN_1
0813: SET GAIN PARAMETER OF GAIN_1 TO 2
0814: CONNECT ORIGINAL SOURCE OF IN1 TO INPUT OF GAIN_1
0815: CONNECT OUTPUT OF GAIN_1 TO ORIGINAL DESTINATION OF OUT1
0816: END_SCRIPT ADD_GAIN_1
```

850

```
0851: BEGIN_VERSION_INFO
0852: VERSION=0
0853: ADDED CG_1
0854: ADDED CG_2
0855: ADDED REFERENCED MODEL
0856: ADDED DISP_1
0857: ADDED DISP_2
0858: CONNECTED CG_1 TO REFERENCED MODEL IN1
0859: CONNECTED CG_2 TO REFERENCED MODEL IN2
0860: CONNECTED DISP_1 TO REFERENCED MODEL OUT1
0861: CONNECTED DISP_2 TO REFERENCED MODEL OUT2
0862: LAST KNOWN VERSION OF REFERENCED MODEL=0
0863: END_VERSION_INFO

0864: BEGIN_VERSION_INFO
0865: VERSION=1
0866: REMOVED CONNECTION OF CG_1 TO REFERENCED MODEL IN1
0867: REMOVED CONNECTION OF DISP_1 TO REFERENCED MODEL OUT1
0868: ADDED GAIN_1
0869: SET GAIN PARAMETER OF GAIN_1 TO 2
0870: CONNECTED CG_1 TO GAIN_1 INPUT
0871: CONNECTED DISP_1 TO GAIN_1 OUTPUT
0872: LAST KNOWN VERSION OF REFERENCED MODEL=1
0873: END_VERSION_INFO
```

AUTOMATIC PROPAGATION OF CHANGES IN A REFERENCED ENTITY

BACKGROUND

Modeling environments may include textual modeling environments and/or graphical modeling environments that may be used to generate, compile, and/or execute one or more models that represent systems. Modeling environments may cater to various aspects of dynamic system simulation, synthesis, analysis, and design. Such modeling environments may allow users to perform numerous types of tasks including, for example, constructing models of systems and simulating the systems using the models.

BRIEF DESCRIPTION OF THE DRAWINGS

The accompanying drawings, which are incorporated in and constitute a part of this specification, illustrate one or more embodiments described herein and, together with the description, explain these embodiments. In the drawings:

FIG. 6A-B illustrate examples of information that may be maintained for the referenced model and information that may be maintained for the parent model that references the referenced model;

FIG. 8 illustrates examples of (1) a script that may be used to modify the parent model in response to changes made to the referenced model and (2) information that may be maintained for the parent model that reflects the changes made to the parent model from executing the script;

DETAILED DESCRIPTION

The following detailed description refers to the accompanying drawings. The same reference numbers in different drawings may identify the same or similar elements. Also, the following detailed description does not limit the invention.

One or more embodiments of the invention may be implemented on one or more computing devices. The one or more computing devices may be a system or part of a system. The one or more computing devices may include a desktop computer, a laptop computer, a client computer, a server computer, a mainframe computer, a personal digital assistant (PDA), a personal navigation device (PND), a web-enabled cellular telephone, a smart phone, a smart sensor/actuator, a processor core, or some other computing device.

One or more embodiments of the invention may receive one or more changes for a first model and change the first model based on the received one or more changes. A second model, which is a parent model to the first model, may be changed based on the one or more changes made to the first model, in order to adapt the second model to accommodate the one or more changes made to the first model. The changes to the second model may be made when processing the second model. The processing may include, for example, compiling, executing, interpreting, analyzing, etc. the second model. As will be described further below, information about one or more changes made to the first model may be maintained and this information may be used to identify one or more changes made to the second model.

Figure 1:
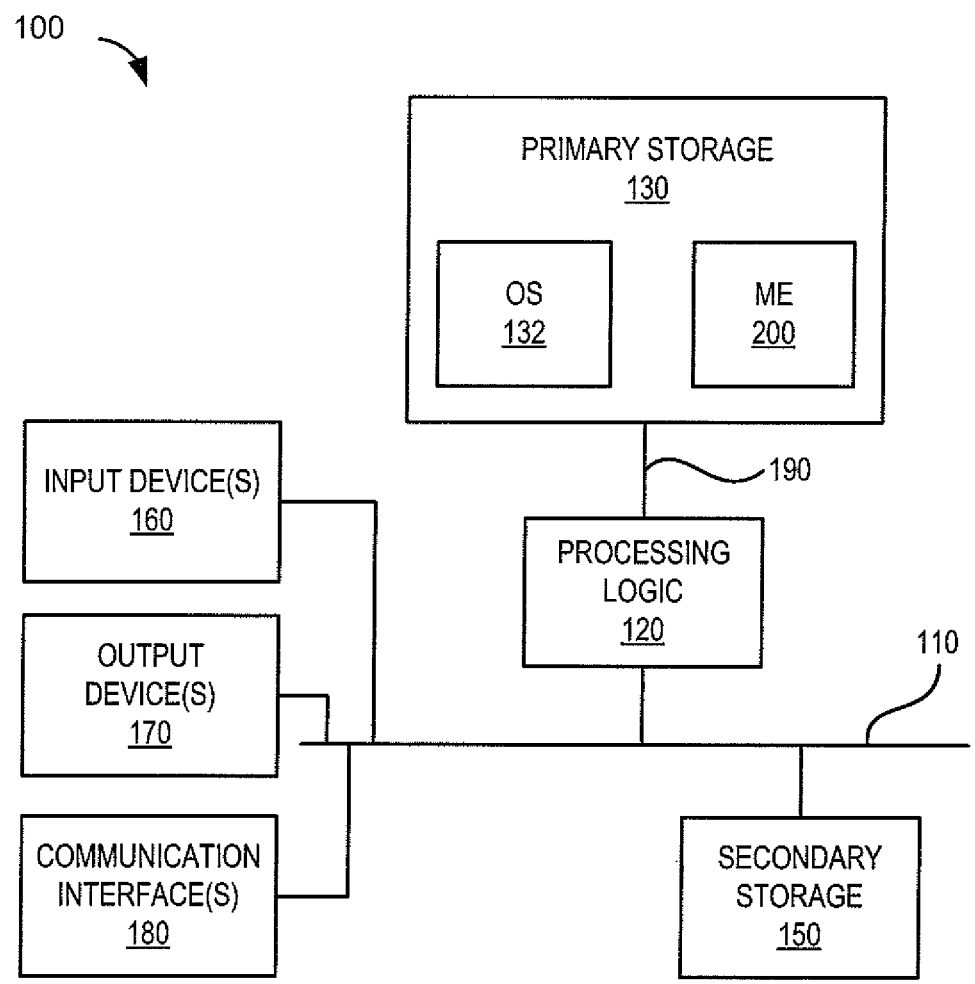
FIG. 1 illustrates an example of a computing device that may be configured to implement one or more embodiments of the invention.

FIG. 1 illustrates an example of a computing device 100 that may be configured to implement one or more embodiments of the invention. Referring to FIG. 1, the computing device 100 may comprise one or more components including an input-output (I/O) bus 110, processing logic 120, a primary storage 130, a secondary storage 150, one or more input devices 160, one or more output devices 170, one or more communication interfaces 180, and a memory bus 190. Computing device 100 is one example of a computing device that may be configured to implement one or more embodiments of the invention. It should be noted that other computing devices that may be less complicated or more complicated than computing device 100 may be configured to implement one or more embodiments of the invention.

The I/O bus 110 may be an interconnect bus configured to enable communication among various components in the computing device 100, such as processing logic 120, secondary storage 150, input devices 160, output devices 170, and communication interfaces 180. The communication may include, among other things, transferring information (e.g., control information, data) among the components.

The memory bus 190 may be an interconnect bus configured to enable information to be transferred between the processing logic 120 and the primary storage 130. The information may include instructions and/or data that may be executed, manipulated, and/or otherwise processed by processing logic 120. The instructions and/or data may include instructions and/or data that are configured to implement one or more embodiments of the invention.

The processing logic 120 may include logic configured to interpret, execute, and/or otherwise process information contained in, for example, the primary storage 130 and/or secondary storage 150. The information may include instructions and/or data configured to implement one or more embodiments of the invention. The processing logic 120 may comprise a variety of heterogeneous hardware. The hardware may include, for example, some combination of one or more processors, microprocessors, field programmable gate arrays (FPGAs), application specific instruction set processors (ASIPs), application specific integrated circuits (ASICs), complex programmable logic devices (CPLDs), graphics processing units, or other types of processing logic that may interpret, execute, manipulate, and/or otherwise process the information. The processing logic 120 may comprise a single core or multiple cores. An example of a processor that may be used to implement processing logic 120 is the Intel Xeon processor available from Intel Corporation, Santa Clara, Calif.

The secondary storage 150 may be a tangible computer-readable media that is accessible to the processing logic 120 via I/O bus 110. The secondary storage 150 may be configured to store information for the processing logic 120. The information may be executed, interpreted, manipulated, and/or otherwise processed by the processing logic 120. The secondary storage 150 may comprise, for example, one or more storage devices, such as magnetic disk drives, optical disk drives, random-access memory (RAM) disk drives, flash drives, or other storage devices. The information may be stored on one or more tangible computer-readable media contained in the storage devices. Examples of tangible computer-readable media that may be contained in the storage devices may include magnetic discs, optical discs, and memory devices (e.g., flash memory devices, static RAM (SRAM) devices, dynamic RAM (DRAM) devices, or other memory devices). The information may include data and/or computer-executable instructions that may implement one or more embodiments of the invention.

The input devices 160 may include one or more devices that may be used to input information into computing device 100. The devices may include, for example, a keyboard, computer mouse, microphone, camera, trackball, gyroscopic device (e.g., gyroscope), mini-mouse, touch pad, stylus, graphics tablet, touch screen, joystick (isotonic or isometric), pointing stick, accelerometer, palm mouse, foot mouse, puck, eyeball controlled device, finger mouse, light pen, light gun, neural device, eye tracking device, steering wheel, yoke, jog dial, space ball, directional pad, dance pad, soap mouse, haptic device, tactile device, neural device, multipoint input device, discrete pointing device, or some other input device. The information may include spatial (e.g., continuous, multi-dimensional) data that may be input into computing device 100 using, for example, using a pointing device, such as a computer mouse. The information may also include other forms of data, such as, for example, text that may be input using a keyboard.

The output devices 170 may include one or more devices that may output information from the computing device 100. The devices may include, for example, a cathode ray tube (CRT), plasma display device, light-emitting diode (LED) display device, liquid crystal display (LCD) device, vacuum florescent display (VFD) device, surface-conduction electron-emitter display (SED) device, field emission display (FED) device, haptic device, tactile device, printer, speaker, video projector, volumetric display device, plotter, or some other output device. The output devices 170 may be directed by, for example, the processing logic 120, to output the information from the computing device 100. The information may be presented (e.g., displayed, printed) by the output devices 170. The information may include, for example, graphical user interface (GUI) elements (e.g., windows, widgets, or other GUI elements), a graphical representation of a model, text, or other information that is presented by the output devices 170.

The communication interfaces 180 may include logic configured to interface the computing device 100 with, for example, one or more communication networks and enable the computing device 100 to communicate with one or more entities connected to the networks. An example of a computer network that may be used with computing device 100 will be described further below with respect to FIG. 12.

The communication interfaces 180 may include one or more transceiver-like mechanisms that enable the computing device 100 to communicate with entities connected to the networks. The communication interfaces 180 may include a built-in network adapter, network interface card (NIC), Personal Computer Memory Card International Association (PCMCIA) network card, card bus network adapter, wireless network adapter, Universal Serial Bus (USB) network adapter, modem or other device suitable for interfacing the computing device 100 to the network.

The primary storage 130 may comprise one or more tangible computer-readable media configured to store information for processing logic 120. The primary storage 130 may be accessible to the processing logic 120 via bus 190. The information may include computer-executable instructions and/or data that may be configured to implement operating system (OS) 132 and modeling environment (ME) 200. The instructions may be executed, interpreted, and/or otherwise processed by processing logic 120.

The primary storage 130 may comprise a RAM that may include one or more RAM devices configured to store information (e.g., data, executable instructions, or other information). The RAM devices may be volatile or non-volatile and may include, for example, one or more DRAM devices, flash memory devices, SRAM devices, zero-capacitor RAM (ZRAM) devices, twin transistor RAM (TTRAM) devices, read-only memory (ROM) devices, ferroelectric RAM (Fe-RAM) devices, magneto-resistive RAM (MRAM) devices, phase change memory RAM (PRAM) devices, or other types of RAM devices.

OS 132 may be a conventional operating system that may be configured to implement various conventional operating system functions, such as, for example, (1) scheduling one or more portions of ME 200 to run on the processing logic 120, (2) managing the primary storage 130, and (3) controlling access to various components in the computing device 100 (e.g., input devices 160, output devices 170, network interfaces 180, secondary storage 150) and information received/transmitted by these components. Examples of operating systems that may be used to implement OS 132 may include, but are not limited to, the Linux operating system, Microsoft Windows operating system, the Symbian operating system, Mac OS operating system, and the Android operating system. A version of the Linux operating system that may be used is Red Hat Linux available from Red Hat Corporation, Raleigh, N.C. Versions of the Microsoft Windows operating system that may be used include Microsoft Windows Vista and Microsoft Windows XP operating systems available from Microsoft Inc., Redmond, Wash. The Symbian operating system is available from Nokia Corporation, Espoo, Finland. The Mac OS operating system is available from Apple, Inc., Cupertino, Calif. The Android operating system is available from Google, Inc., Menlo Park, Calif.

ME 200 may be a modeling environment (e.g., a graphical modeling environment, textual modeling environment, hybrid graphical/textual modeling environment, or other modeling environment) that may be configured to implement one or more embodiments of the invention. Some or all of ME 200 may operate under the control of OS 132. Moreover, some or all of ME 200 and/or OS 132 may operate under control of virtualization software, which may or may not be hardware assisted. Examples of virtualization software include, but are not limited to, Bochs, QEMU, VMware, Xen, and OpenVZ.

Figure 2:
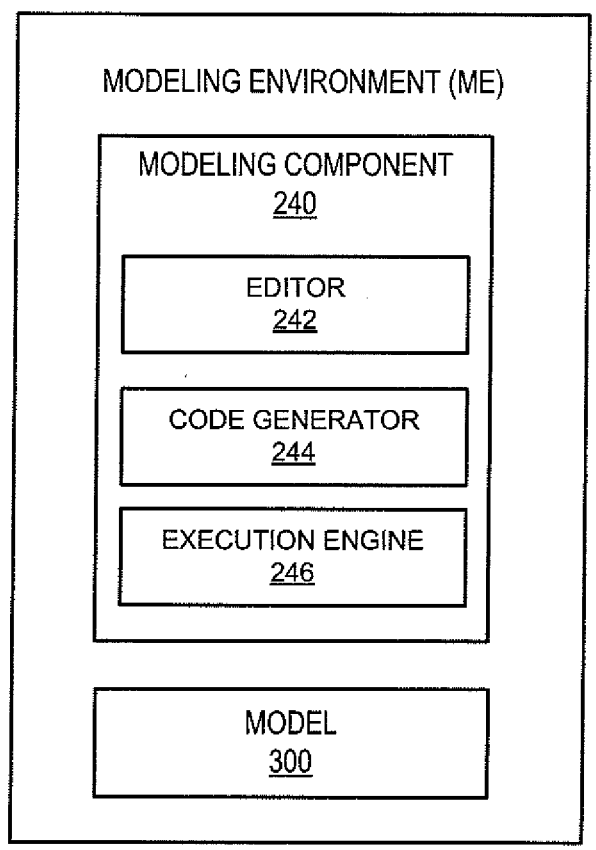
FIG. 2 illustrates an example of a modeling environment (ME) that may be configured to implement one or more embodiments of the invention.

FIG. 2 illustrates an example implementation of ME 200. Referring to FIG. 2, ME 200 may comprise various components including, for example, modeling component 240 and model 300. ME 200 may be configured to, among other things, construct model 300, generate code and comments from model 300, compile and link the generated code, execute the compiled and linked code, and/or interpret model 300.

The ME 200 may include hardware-based and/or software-based logic configured to provide a computing environment that may allow, for example, a user to perform tasks related to disciplines, such as, but not limited to, mathematics, science, engineering, medicine, business, biology, and finance. The ME 200 may include a dynamically-typed programming language (e.g., the MATLAB® language) that can be used to express problems and/or solutions in mathematical notations.

For example, the ME 200 may use an array as a basic element, where the array may not require dimensioning. These arrays may be used to support array-based programming where an operation can apply to an entire set of values included in the arrays. Array-based programming may allow array-based operations to be treated as a high-level programming technique that may allow, for example, operations to be performed on entire aggregations of data without having to resort to explicit loops of individual non-array operations.

In addition, the ME 200 may be configured to perform matrix and/or vector formulations that may be used for data analysis, data visualization, application development, simulation, modeling, and/or algorithm development. These matrix and/or vector formulations may be used in many areas, such as statistics, image processing, signal processing, control design, life sciences modeling, discrete event analysis and/or design, and state-based analysis and/or design.

The ME 200 may further provide mathematical functions and/or graphical tools that may be used for creating plots, surfaces, images, volumetric representations, or other representations. The ME 200 may provide these functions and/or tools using toolboxes (e.g., toolboxes for signal processing, image processing, data plotting, and/or parallel processing). In addition, the ME 200 may provide these functions as block sets. The ME 200 may also provide these functions in other ways, such as via a library, local or remote database, and so on.

Examples of MEs that may be modified to incorporate one or more embodiments of the invention include, but are not limited to, MATLAB®, Simulink®, Stateflow®, Simscape™, and SimEvents®, which are available from The MathWorks, Inc., Natick, Mass.; Unified Modeling Language (UML); profiles associated with UML (e.g., Modeling Analysis and Real-Time Embedded Systems (MARTE), Systems Modeling Language (SysML), Avionics Architecture Description Language (AADL)); GNU Octave from the GNU Project; MATRIXx and LabView® from National Instruments; Mathematica from Wolfram Research, Inc.; Mathcad from Mathsoft Engineering & Education Inc.; Maple from Maplesoft; Extend from Imagine That, Inc.; Scilab and Scicos from The French Institution for Research in Computer Science and Control (INRIA); Modelica and Dymola from Dynasim AB; VisSim from Visual Solutions; SoftWIRE from Measurement Computing Corporation; WiT from DALSA Coreco; VEE Pro and SystemVue from Agilent Technologies, Inc.; Vision Program Manager from PPT Vision, Inc.; Khoros from Khoral Research, Inc.; VisiQuest from Pegasus Imaging Corporation; Gedae from Gedae, Inc.; Virtuoso from Cadence Design Systems, Inc.; Rational Rose, Rhapsody, and Tau from International Business Machines (IBM), Inc.; SCADE from Esterel Technologies; the Eclipse development platform from the Eclipse Foundation; MagicDraw from No Magic, Inc.; CoWare from CoWare, Inc.; and Ptolemy from the University of California at Berkeley.

Model 300 may be, for example, a time-based graphical block diagram model, a state transition diagram, a discrete event model, an activity diagram, a UML diagram, a sequence diagram, a data flow model, or some other type of model or diagram. Model 300 may be configured to represent a system, such as a physical system. Model 300 may be graphical, textual, or some combination of graphical and textual. The system represented by model 300 may be dynamic, linear, non-linear, or some other type of system.

A dynamic system (either natural or man-made) may be a system whose response at any given time may be a function of its input stimuli, its current state, and a current time. Such systems may range from simple to highly complex systems. Natural dynamic systems may include, for example, a falling body, the rotation of the earth, bio-mechanical systems (muscles, joints, etc.), bio-chemical systems (gene expression, protein pathways), weather, and climate pattern systems. Examples of man-made or engineered dynamic systems may include, for example, a bouncing ball, a spring with a mass tied on an end, automobiles, airplanes, control systems in major appliances, communication networks, audio signal processing systems, and a stock market.

The system represented by model 300 may have various execution semantics that may be represented in model 300 as a collection of modeling elements, often referred to as blocks. A block may generally refer to a portion of functionality that may be used in the model 300. The block may be graphically represented, however, it can be appreciated that the block does not necessarily need to be represented graphically. For example, the block may be represented textually or stored in some form of internal representation. Also, a particular visual depiction used to represent the block, for example in a graphical block diagram, may be an arbitrary design choice.

A block may be hierarchical in that the block itself may comprise one or more blocks that make up the block. A block comprising one or more blocks (sub-blocks) may be referred to as a subsystem block. A subsystem block may be configured to represent a subsystem of the overall system represented by the model.

Modeling component 240 may contain computer-executable instructions and data that are configured to perform various tasks. These tasks may include (1) constructing model 300, for example, through a GUI; (2) allowing an augmentation of a pre-defined set of blocks with custom user-specified blocks that may be associated with model 300; (3) using model 300 to compute and trace a temporal evolution of outputs associated with a dynamic system represented by the model 300; (4) automatically producing, for example, deployable software systems, and descriptions of hardware systems that mimic a behavior of either the entire model 300 or portions of model 300; and (5) generating code and comments for model 300. The blocks may be represented in a graphical representation (e.g., a block diagram) of the model 300 that may be presented by the ME 200 to a user via an output device 170.

The modeling component 240 may include an editor 242, code generator 244, and execution engine 246. The editor 242 may be configured to allow a user to, for example, specify, edit, annotate, save, print, and/or publish model 300.

The code generator 244 may be configured to generate code (e.g., source code) based on the model 300. The generated code may be editable using editor 242. The execution engine 246 may be configured to compile and link the generated code to produce an "in-memory executable" version of model 300. The in-memory executable version of model 300 may be used, for example, to simulate, verify, trim, or linearize the model 300. It should be noted that execution engine 246 may be configured to interpret the generated code in order to, for example, simulate, verify, trim, and/or linearize the model 300.

Figure 3:
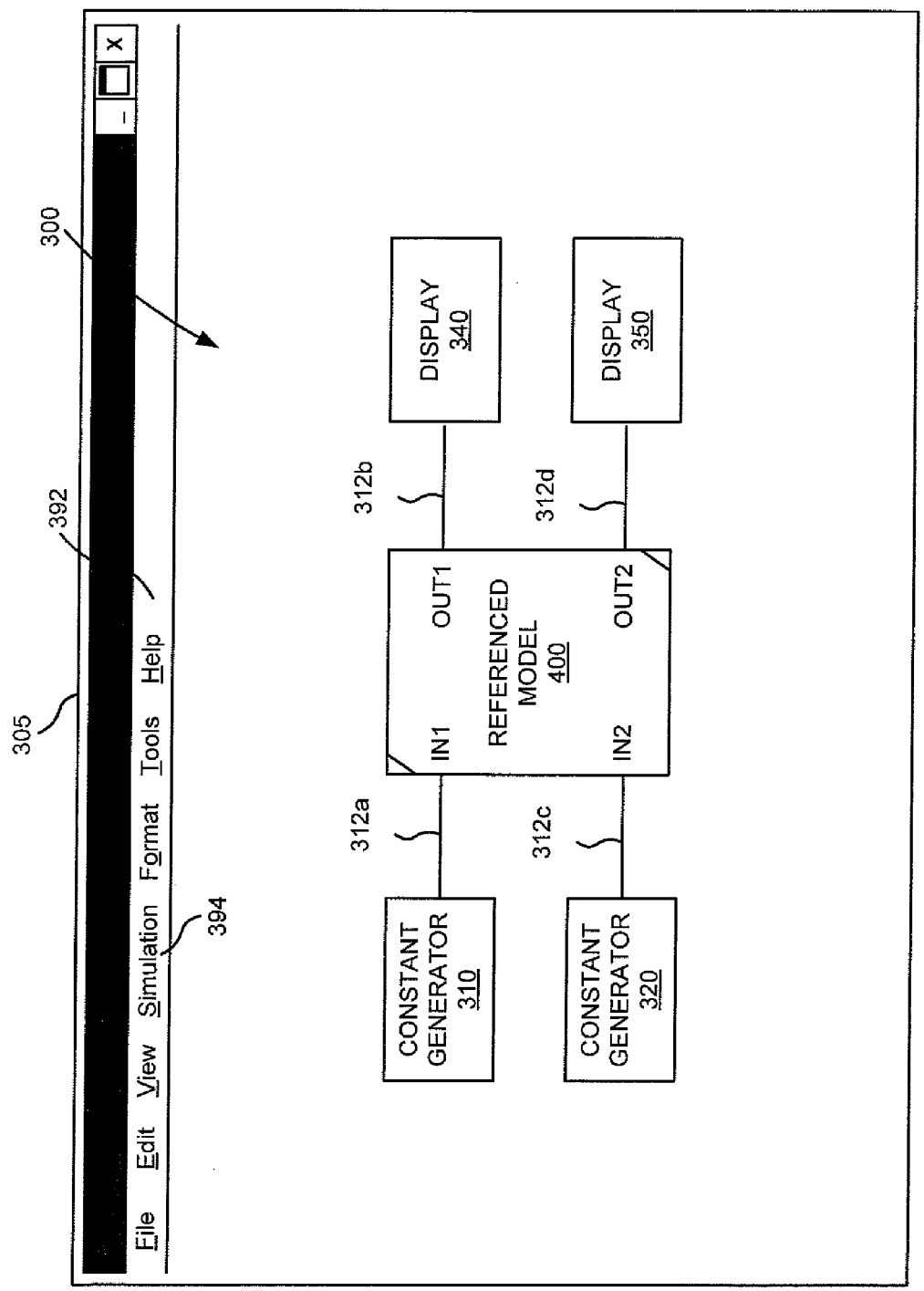
FIG. 3 illustrates an example block diagram of a parent model that references a referenced model.

FIG. 3 illustrates an example block diagram of an embodiment of model 300. Referring to FIG. 3, a user may interact with model 300 through a graphical window 305 that may be provided by ME 200. Graphical window 305 may provide an interface through which commands relating to model 300 may be entered. Graphical window 305 may include a menu bar 392 that may allow the user to select various menus. A menu may contain one or more menu items that when selected may perform various functions. For example, menu bar 392 contains a "Simulation" menu 394, which may include a menu item (not shown) that when selected may start a simulation of model 300. It should be noted that other techniques may be used to perform functions related to model 300. For example, a command line interface may be provided in a separate window (not shown) that enables commands relating to the model 300 to be entered. The commands when entered may perform various functions associated with the model 300.

Model 300 includes a first constant generator 310, a second constant generator 320, a referenced model 400, a first display 340, and a second display 350. An output of the first constant generator 310 is connected to the referenced model 400 at a first input (IN1) of the referenced model 400 via connection 312a. Likewise, the second constant generator 320 is connected to the referenced model 400 at a second input (IN2) of the referenced model 400 via connection 312c. The first constant generator 310 may generate a first constant value that is input into the referenced model 400 via IN1. Likewise, the second constant generator 320 may generate a second constant value that is input into the referenced model 400 via IN2.

Referenced model 400 provides two outputs. A first output (OUT1) is connected to display 340 via connection 312b. A first value may be outputted via OUT1 to display 340, which may provide a display of the first value on an output device, such as output device 170. Likewise, a second output (OUT2) is connected to display 350 via connection 312d. A second value may be outputted via OUT2 to display 350, which may provide a display of the second value on an output device, such as output device 170. Model 300 may be called a "parent" model to referenced model 400 since it references referenced model 400. Likewise, referenced model 400 may be called a "child" model of model 300 since referenced model 400 is referenced by model 300.

Referenced model 400 may be separate from model 300. For example, referenced model 400 may be contained in a library, which may reside in a location that is different from the location of model 300. Referenced model 400 may be represented in model 300 by a pointer to referenced model 400. Referenced model 400 may be a standalone model in that it may be processed (e.g., edited, executed, interpreted, code generated from, analyzed, or some other processing) separate from model 300. As will be described further below, during a processing (e.g., editing, executing, interpreting, code generating, analyzing, or some other processing) of model 300, model 300 may reference referenced model 400. Processing this reference to referenced model 400 may include making changes to model 300 based on changes made to referenced model 400.

Figure 4:
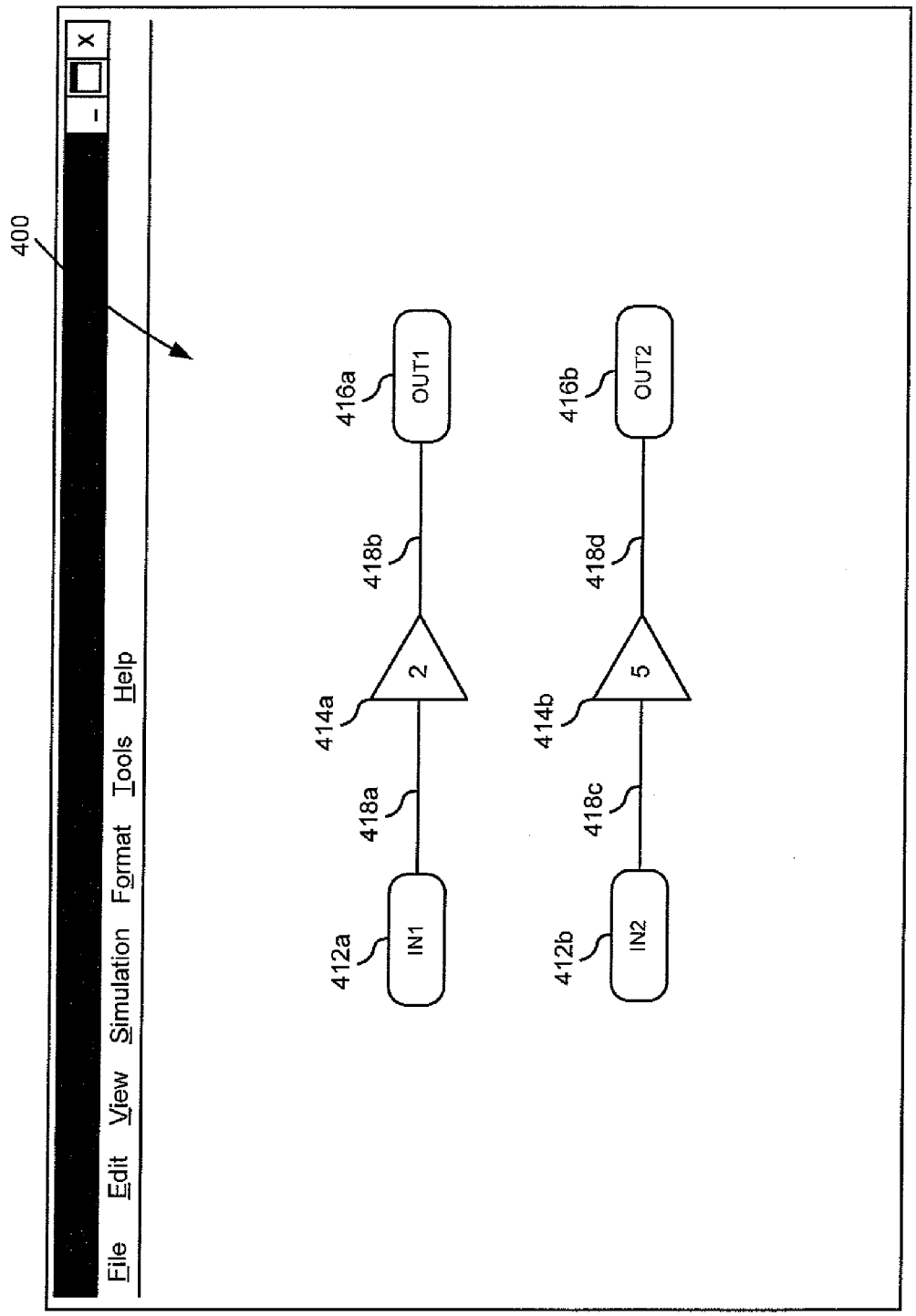
FIG. 4 illustrates an example block diagram of the referenced model.

FIG. 4 illustrates an example block diagram of referenced model 400. Referring to FIG. 4, referenced model 400 may include input port (inport) 412a, gain 414a, output port (outport) 416a, inport 412b, gain 414b, and outport 416b. Inport 412a is connected to an input of gain 414a via connection 418a. An output of gain 414a is connected to outport 416a via connection 418b. Likewise, inport 412b is connected to an input of gain 414b via connection 418c; and, an output of gain 414b is connected to outport 416b via connection 418d.

Operationally, inport 412a receives a first value that is input into referenced model 400 at input IN1. Gain block 414a amplifies the first value by a factor of "2" and outputs the amplified first value to outport 416a. Outport 416a outputs the amplified first value from referenced model 400 at output OUT1. Likewise, inport 412b receives a second value that is input into referenced model 400 at input IN2. Gain block 414b amplifies the second value by a factor of "5" and outputs the amplified second value to outport 416b. Outport 416b outputs the amplified second value from referenced model 400 at output OUT2.

Figure 5:
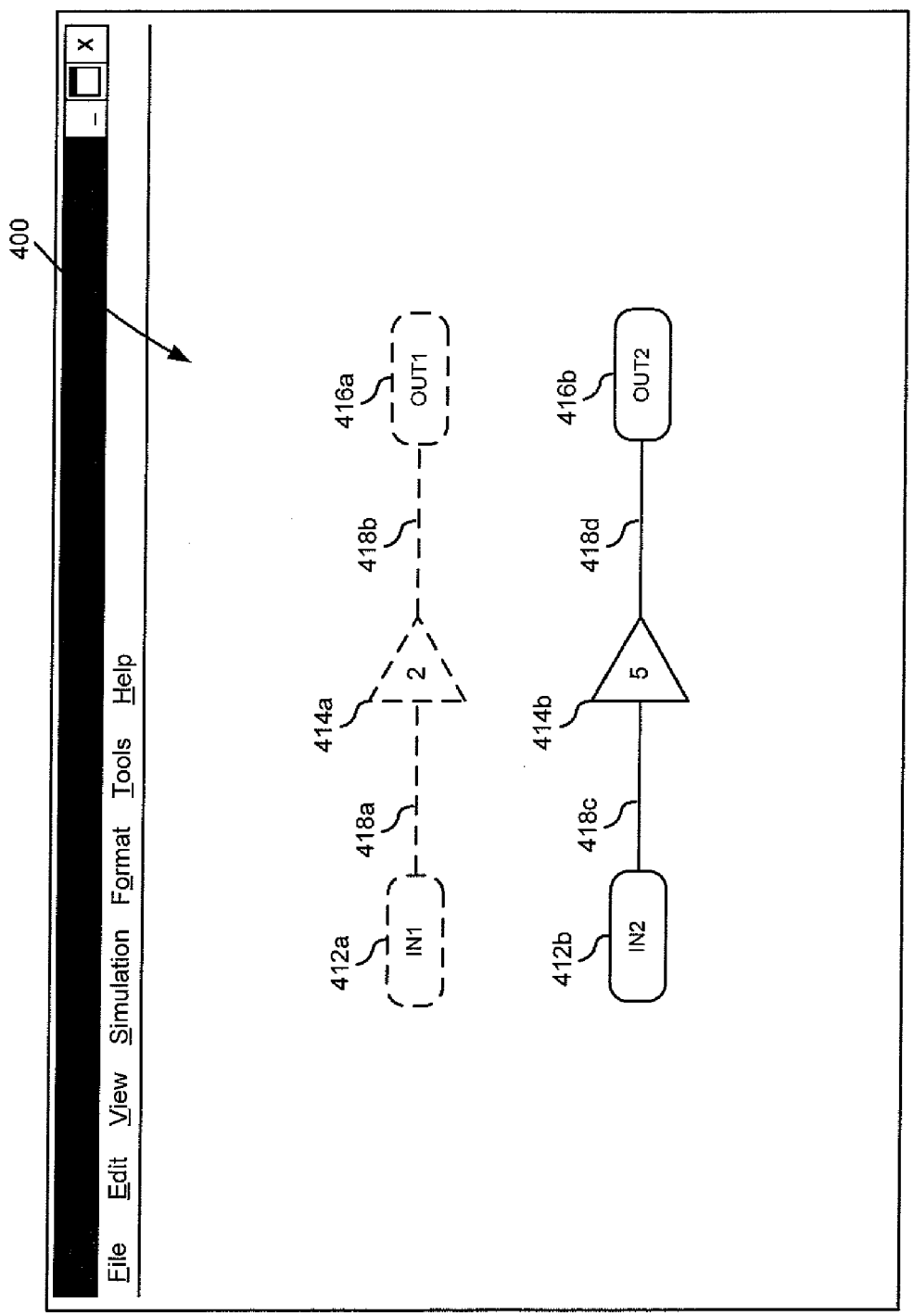
FIG. 5 illustrates an example block diagram of a change made to the referenced model.

Now suppose that blocks 412a, 414a, and 416a, and connections 418a-b are deleted from referenced model 400. FIG. 5 illustrates an example block diagram of this change made to the referenced model 400. Referring to FIG. 5, the dotted outlines for blocks 412a, 414a, and 416a, and connections 418a-b indicate that these blocks and connections, respectively, have been deleted.

Information may be maintained with regards to the creation and modification of referenced model 400. FIG. 6A illustrates an example of information 610 that may be maintained for referenced model 400. Referring to FIG. 6A, information 610 includes information regarding a first version and a second version of referenced model 400.

The information for the first version of referenced model 400 begins at line 611 and ends at line 625. Specifically, line 611 indicates the beginning of the information for the first version and line 625 indicates the end of the information. Line 612 contains information about the first version's version number, which in this example is "0". Lines 613, 614, 615, 616, 617, and 618, indicate that blocks 412a, 412b, 414a, 414b, 416a, and 416b, respectively, have been added to referenced model 400. Lines 619, 620, 621, and 622 indicate that connections 418a, 418b, 418c, and 418d have been made. Lines 623 and 624 indicate that the value of a gain parameter associated with gain 414a has been set to "2" and the value of a gain parameter associated with gain 414b has been set to "5", respectively. Note that in this example, the information at lines 611 through 625 include information associated with the creation of referenced model 400.

Lines 626 through 633 hold information associated with the second version of referenced model 400. Specifically, lines 626 and 633 indicate the beginning and end of the information for the second version, respectively. Line 627 indicates a version number associated with the second version. In this example, this version number is "1". Lines 628, 629, and 630 indicate that blocks 412a, 414a, and 416a were removed. Lines 631 and 632 indicate that connections 418a and 418b were removed. Note that in this example, the information at lines 626 through 633 represent changes made to referenced model 400 since the first version.

FIG. 6B illustrates an example of information 650 that may be maintained for model 300 with regards to creating and modifying model 300. Referring to FIG. 6B, the information may include information associated with a first version and a second version of model 300. Lines 651 through 663 contain version information associated with the first version of model 300 and lines 664 through 669 contain version information associated with the second version of model 300. In this example, information associated with the first version of model 300 includes information associated with the creation of the model 300. Moreover, the information associated with the second version of the model 300 includes information that describes changes made to the model 300 since the first version.

Specifically, lines 651 and 663 indicate a beginning and end of the information associated with the first version of model 300. Line 652 indicates a version number for the first version, which in this example is "0". Lines 653, 654, 655, 656, and 657 indicate that blocks 310, 320, 400, 340, and 350 were added to model 300, respectively. Lines 658, 659, 660, and 661 indicate that connections 312a, 312b, 312c, and 312d were made, respectively. Line 662 indicates a last known version of the referenced model 400 that was seen (e.g., accessed) by the first version of model 300. In this example, the last known version of referenced model 400 indicated at line 662 is version "0" of model 400.

Lines 664 and 669 indicate a beginning and end of the second version information for model 300. Line 665 indicates a version number associated with the second version, which in this example is "1". Lines 666 and 667 indicate that the connections 312a and 312b, respectively, have been removed. Line 668 indicates the last known version of the referenced model 400 that was seen by the second version of model 300. In this example, the last known version of referenced model 400 indicated at line 668 is version "1" of model 400. Note that the changes made to model 300 in the second version of model 300 may be made in response to the changes made to referenced model 400 in the second version of referenced model 400.

Figure 7:
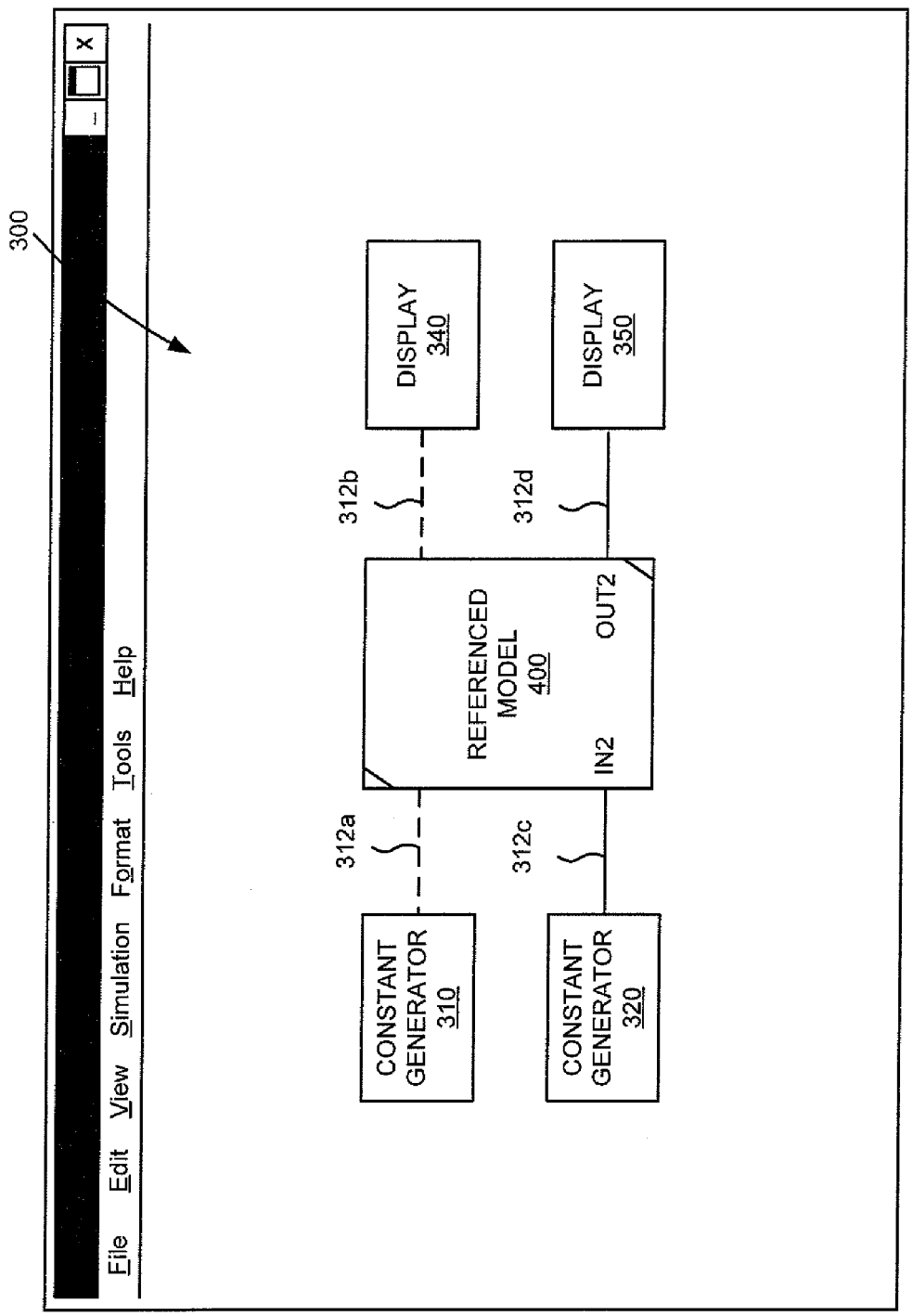
FIG. 7 illustrates an example of changes that may be made to the parent model in response to changes made to the referenced model.

FIG. 7 illustrates an example of changes that may be made to model 300 in response to changes made to the referenced model 400. Specifically, the ME 200 may update model 300 in response to the changes made to the referenced model 400. The updating may occur in response to processing (e.g., editing, compiling, executing, interpreting, analyzing, or some other processing) the model 300. During the processing of model 300, it may be determined that the referenced model 400 has changed. For example, during processing of model 300, the referenced model 400 may be accessed and changes to the referenced model 400 may be identified. In this example, the updating may include removing connections 312a and 312b from model 300, since input IN1 and output OUT1 were removed from referenced model 400. Note that the removed connections 312a and 312b are illustrated in FIG. 7 as dashed lines.

Note that changes made to the model 300 may be recorded in information 650. Specifically, lines 664 through 669 contain information that relates to the above changes made to the model 300.

A script, containing, for example, code, instructions, directives, etc., may be executed to make changes to model 300 in response to changes made to the referenced model 400. These changes may be made to accommodate changes made to the referenced model 400 and/or in addition to changes made to accommodate the changed referenced model 400. FIG. 8 illustrates an example of a script 810 that may be used to change model 300 in response to changes made to referenced model 400. In addition, FIG. 8 illustrates an example of information 850 that may be maintained for model 300 that reflects changes made to model 300 as a consequence of performing (e.g., executing, interpreting) the script 810.

Referring to FIG. 8, lines 811 through lines 816 illustrate an example of a script 810 that may be used to modify model 300 in response to changes made to referenced model 400. Specifically, lines 811 and 816 indicate a beginning and end, respectively, of the script 810. At line 812, a gain block named "GAIN_1" is added to model 300 and at line 813, a value of a gain parameter associated with the added gain block GAIN_1 is set to "2". At line 814, a connection is made from the original source of input IN1 to the input of the added gain block GAIN_1. The original source of IN1, in this example, is the output of constant generator 310. Likewise, at line 814, the output of the added gain block GAIN_1 is connected to the original destination of output OUT1. In this example, the original destination of output OUT1 is the input of display block 340.

Information about the above changes made to model 300 may be included in information 850. Specifically, lines 864 through 873 may include information about the above changes made to model 300 in response to changes made to the referenced model 400 and performing script 810. Lines 864 and 873 indicate a beginning and an end of the information, respectively. Line 865 indicates a version of the changed model 300, which in this example is "1". Line 872 indicates the last known version of the referenced model 400. In this example, the last known version is version "1" of the referenced model 400. Lines 866 and 867 indicate that connections 312a and 312b, respectively, were removed from model 300.

Lines 868 through 871 provide information about the changes made to model 300 from an execution of script 810. Specifically, line 868 indicates that a gain block (GAIN_1) was added to the model 300. Line 869 indicates that a gain parameter associated with the added gain block was set to "2". Line 870 indicates that a connection was made from the output of the constant generator 310 to the added gain block's input. Line 871 indicates that a connection from the added gain block's output was made to the input of display block 340.

Figure 9:
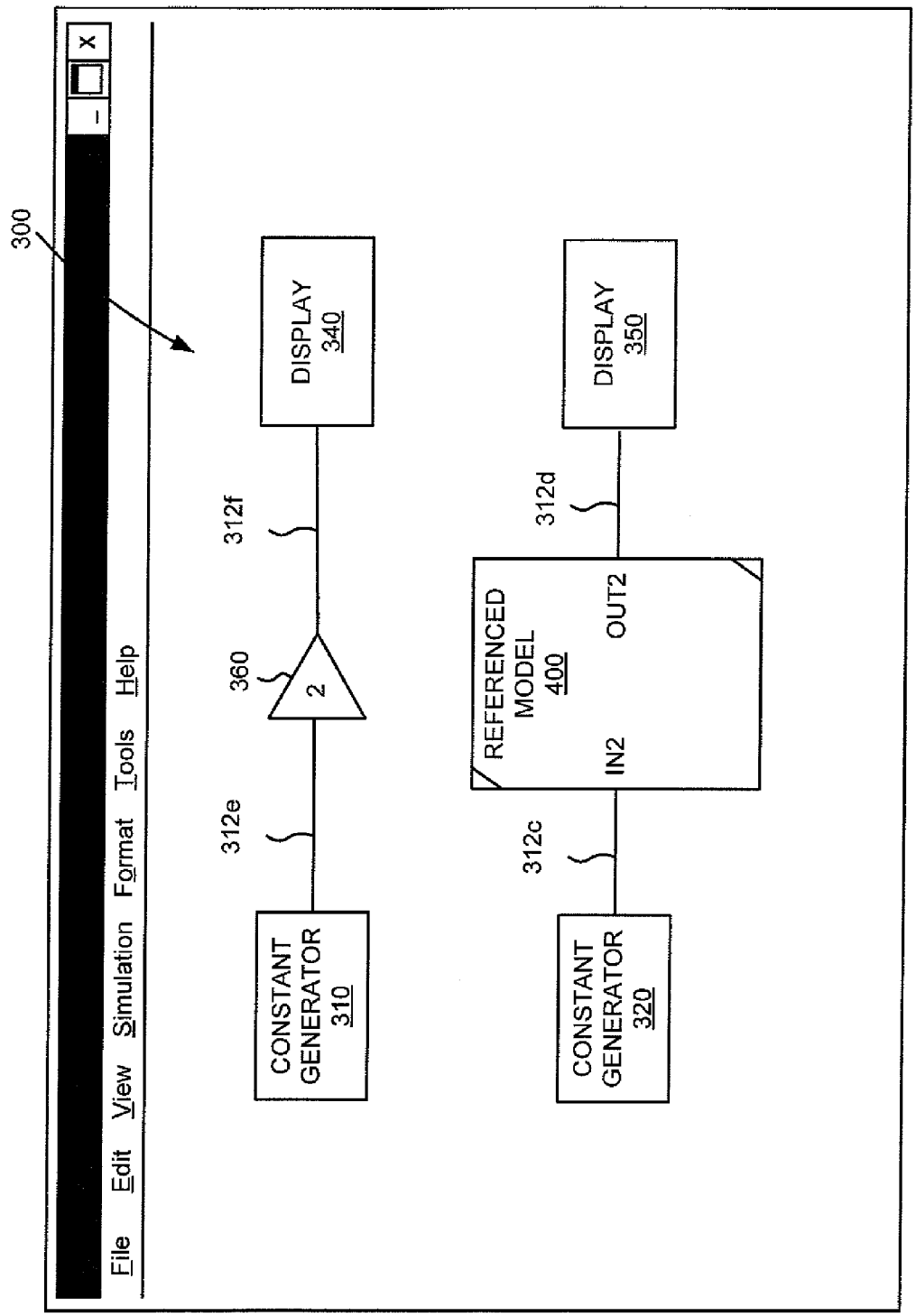
FIG. 9 illustrates a block diagram of the parent model after it has been modified in response to executing the script illustrated in FIG. 8.

FIG. 9 illustrates a block diagram of model 300 as modified above in response to changes made to referenced model 400 and in response to the execution of script 810. Referring to FIG. 9, gain block 360 has been added to model 300. This change was recorded in information 850 at line 868. Moreover, as noted above, the gain parameter associated with the gain block GAIN_1 is set to a value of "2" as recorded in information 850 at line 869. In addition, connection 312e has been added to connect the output of constant generator 310 to the input of the added gain block 360 and connection 312f has been added to connect the output of gain block 360 to the input of display block 340. These changes were recorded in information 850 at lines 870 and 871, respectively. It should be noted that information 850 may be maintained in a log (e.g., computer file, database), which may be stored in storage, such as primary storage 130 and/or secondary storage 150. Moreover, script 810 may be stored, for example in a file or a database, in storage, such as primary storage 130 and/or secondary storage 150.

Figure 10:
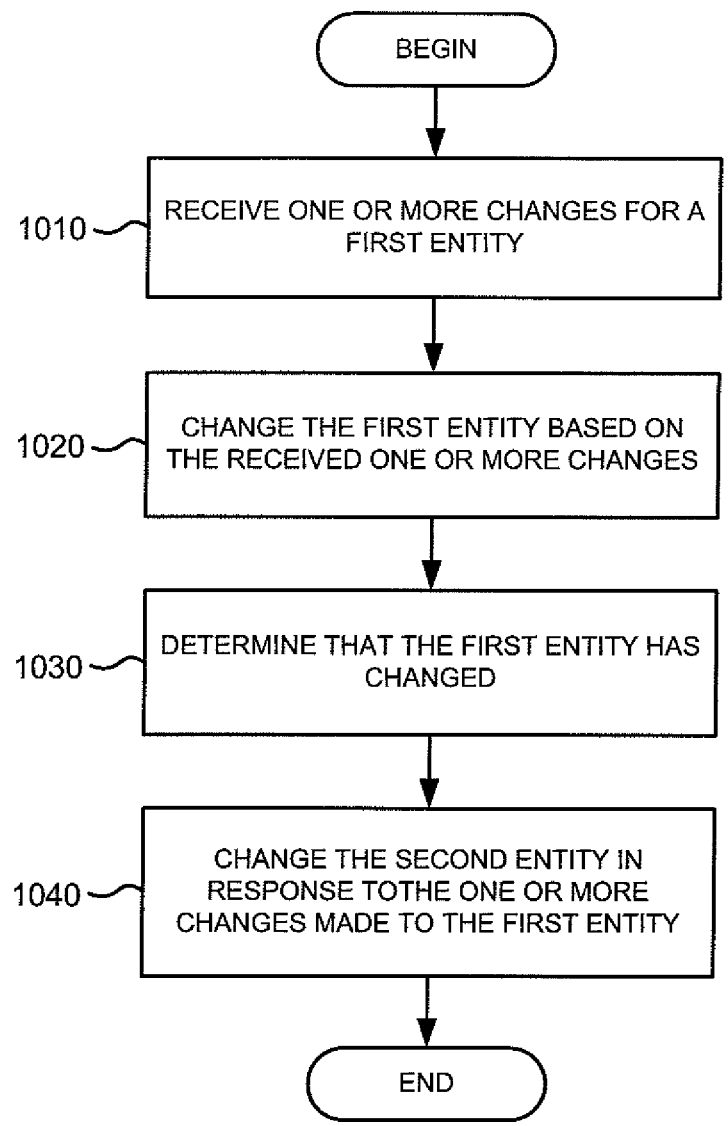
FIG. 10 illustrates a flowchart of example acts that may be used to (1) change a first entity and (2) change a second entity in response to changes made to the first entity.

FIG. 10 illustrates a flowchart of example acts that may be used to (1) change a first entity and (2) change a second entity in response to one or more changes made to the first entity. Here, the first entity may be, for example, a referenced model, a referenced subsystem, etc. Likewise, the second entity may be, for example, a parent model that references the first entity.

Referring to FIG. 10, at block 1010, one or more changes for the first entity are received. For example, the first entity may be a referenced model, such as model 400, and the changes may be received by an ME from a user via an editor, such as editor 242. Alternatively, the changes may be received from some other source, such as a computer file. For example, the first entity may be a configurable subsystem which may change based on a particular selected configuration or variant of the subsystem. Here, changes made to the first entity may be received from storage (e.g., a file, library, database) that may store various selectable configurations or variants of the subsystem.

At block 1020, the first entity is changed based on the received changes. In the above example, the ME may receive the changes and modify the model accordingly. In addition, information about changes made to the first entity may be maintained. For example, in the above example, the ME may generate information about the changes made to the model, as described above. The information may be maintained in a log, which, as noted above, may be stored in storage, such as primary storage 130 and/or secondary storage 150.

At block 1030, it is determined that the first entity has changed. For example, the second entity may be a parent model that references the above-described referenced model. The referenced model may be referenced when the parent model is being processed (e.g., edited, compiled, executed, interpreted, or some other processing) by, for example, an ME. The ME may determine the referenced model has changed using a current version information of the referenced model and a last known version information of the referenced model. Alternatively, information about changes made to the first entity may be analyzed to determine if it has changed.

At block 1040, the second entity is changed in response to the one or more changes made to the first entity. The changes made to the second entity may be made to accommodate the changes made to the first entity. For example, the parent model may be changed based on information that is maintained for changes made to the referenced model. Moreover, as noted above, a script (e.g., code) may be performed to make changes to the second entity in response to changes made to the first entity. For example, if the first entity is a configurable subsystem, the configurable subsystem may be associated with a script that when executed makes one or more changes to the second entity according to the configuration of the configurable subsystem. Likewise, for example, a script may be associated with information that is maintained for the first entity that describes changes made to the first entity. The script may be performed to make changes to the second entity based on the information maintained for the first entity.

Referring now to FIGS. 1-7 and 10, suppose, for example, that a user directs ME 200 to generate model 300 and referenced model 400. ME 200 may generate model 300 as depicted in FIG. 3 and referenced model 400 as depicted in FIG. 4 in response to the user's input. In addition, ME 200 may generate lines 611 through 625 in information 610 (FIG. 6A) to maintain information related to the creation of referenced model 400. ME 200 may also generate lines 651 through 663 in information 650 (FIG. 6B) to maintain information related to the creation of model 300. Note that the ME 200 may indicate in the information that the last known version of the referenced model 400 that is known to model 300 is version "0" of the referenced model 400.

Now suppose that the user uses editor 242 to change referenced model 400 to remove inport block 412a, gain block 414a, outport block 416a, and connections 418a-b, as depicted in FIG. 5. ME 200 receives the changes (block 1010) and changes the referenced model 400 based on the received changes (block 1020). The changes may include removing inport block 412a, gain block 414a, outport block 416a, and connections 418a-b from the referenced model 400, as directed by the user. The ME 200 may maintain information about the above changes to referenced model 400 in information 610 (block 1020). Specifically, the ME 200 may generate lines 626 to 633 in information 610 to maintain information about the changes. Note that the information indicates that the latest version of referenced model 400 is version "1". The ME 200 may further store this information in storage, such as primary storage 130 or secondary storage 150.

Now suppose ME 200 processes model 300 and determines that model 300 references referenced model 400. ME 200 may then compare the information associated with the current version of the referenced model 400 at line 627 in information 610 with the last known version of the referenced model 400 that is indicated at line 662 in information 650 to determine that the referenced model 400 has changed (block 1030). ME 200 may analyze the information at lines 626 through 633 to identify changes made to the referenced model 400. In addition, ME 200 may identify changes to be made to model 300 based on the identified changes made to the referenced model 400. ME 200 may then implement the identified changes for model 300 (block 1040). Specifically, ME 200 may determine from the information at lines 626 through 633 that the inport block 412a, the outport block 416a, and connections 418a-b have been removed from the referenced model 400. In response to these changes to referenced model 400, the ME 200 may determine that connections 312a and 312b, which connect to IN1 and OUT2 of referenced model 400, respectively, are to be removed as a consequence of blocks 412a and 416a being removed. ME 200 may then remove connections 312a and 312b in model 300 in order to accommodate the changes that were made to the referenced model 400.

Figure 11A:
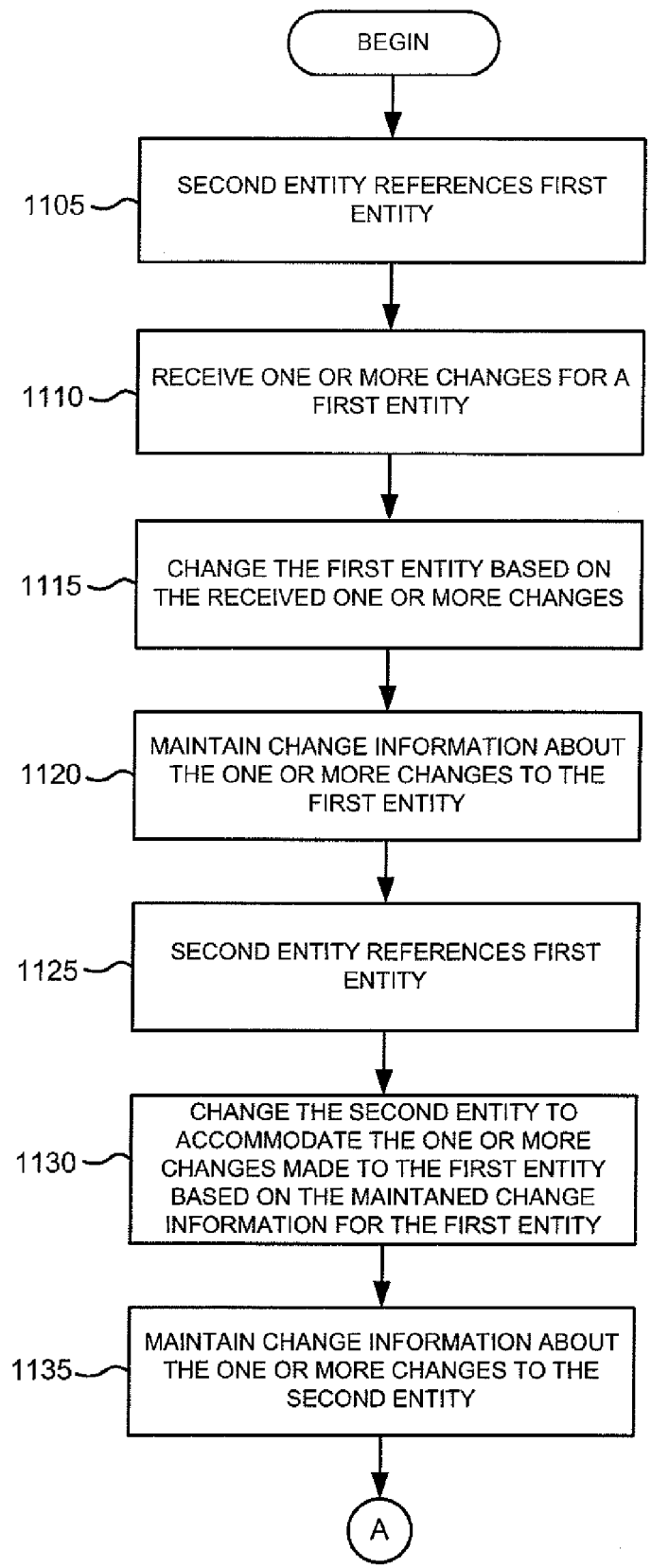
FIGS. 11A-B illustrate a flowchart of example acts that may be used to (1) change a first entity, (2) maintain information that reflects the changes made to the first entity, (3) change a second entity in response to changes made to the first entity, (4) maintain information that reflects the changes made to the second entity, (5) undo changes made to the first entity based on the information maintained for the first entity, and (6) undo changes made to the second entity based on the information maintained for the second entity.
Figure 11B:
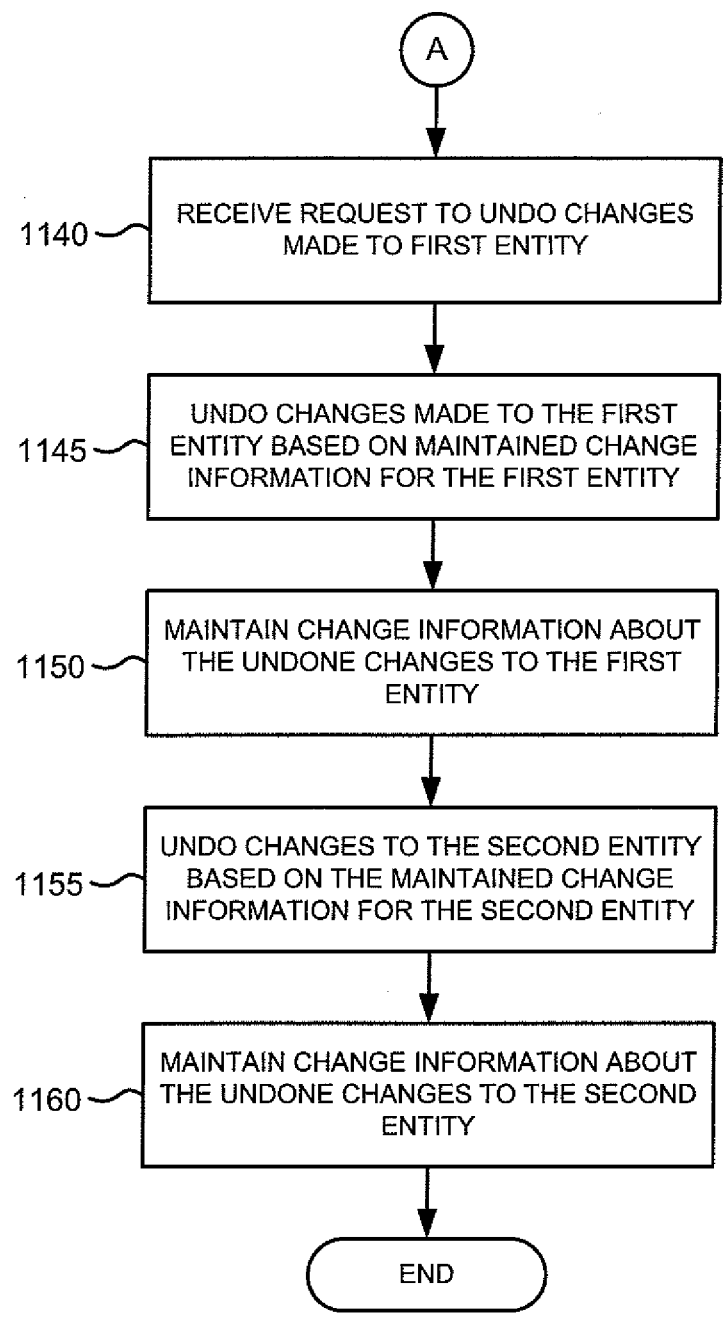

FIGS. 11A-B illustrate a flowchart of example acts that may be used to (1) change a first entity, (2) change a second entity in response to one or more changes made to the first entity, and (3) undo one or more changes made to the second entity in response to an undoing of one or more changes made to the first entity.

Referring to FIG. 11A, at block 1105, a second entity references (e.g., accesses) a first entity. The first entity may be a referenced model, such as model 400, a referenced subsystem, etc. The second entity may be parent model, such as model 300. The first entity may be accessed during processing (e.g., compiling, generating, executing, interpreting, analyzing, or some other processing) of the second entity. As part of the processing, the second entity may maintain information that indicates the last seen (known) version of the first entity, as described above. At block 1110, one or more changes for the first entity are received. The changes may be received through an editor associated with an ME, such as editor 242. At block 1115, the first entity is changed based on the received one or more changes. At block 1120, information about changes made to the first entity is maintained. For example, the ME may maintain the information in a log, which, as noted above, may be stored in storage, such as primary storage 130 and/or secondary storage 150.

At block 1125, the second entity references the first entity after the first entity has been changed. As noted above, for example, the second entity may be a parent model and the first entity may be a referenced model that is referenced by the parent model. The referenced model may be referenced when the parent model is being processed (e.g., edited, compiled, executed, interpreted, or some other processing).

At block 1130, the second entity is changed to accommodate one or more changes made to the first entity. The second entity may be changed based on change information that is maintained for the first entity. In the above example, the parent model may be changed based on information that relates to changes made to the referenced model.

At block 1135, information about changes made to the second entity is maintained. This information may include, for example, blocks or connections that are added or removed from the second entity, changes in connections to blocks in the second entity, values of parameters associated with blocks in the second entity (e.g., setting a value of a gain parameter associated with a gain block), etc. As noted above, this information may be maintained in a log.

At block 1140 (FIG. 11B), a request is received to undo changes made to the first entity. The request may be, for example, triggered by a user and received by an ME. At block 1145, changes made to the first entity are undone based on maintained information for the first entity. Here, changes made to the first entity may be identified from the maintained information. The identified changes may then be undone. For example, if a change identified from the maintained information indicates that a block was deleted from the first entity, an ME may undo the change by recreating the block and adding the recreated block to the first entity.

At block 1150, information is maintained about changes made to the first entity with respect to undoing previous changes to the first entity. For example, in the above example, after recreating the block and adding the recreated block to the first entity, the ME may maintain information with respect to these changes, as described above.

At block 1155, changes made to the second entity are undone based on change information maintained for the second entity. For example, in the above example, if the changes made to the second entity include deleting a connection in response to the block being deleted in the first entity, the ME may identify this change from the information maintained for the second entity. The ME may undo this change by restoring the connection.

At block 1160, information is maintained about changes made to the second entity to undo the previous changes. This information may be maintained as described above.

Referring now to FIGS. 1-7 and 11A-B, suppose, for example, that a user directs ME 200 to generate model 300 and referenced model 400 then directs ME 200 to change the models 300, 400, as described above. ME 200 may generate model 300, as depicted in FIG. 3, and referenced model 400, as depicted in FIG. 4, and make changes to the generated referenced model 400, as depicted in FIG. 5, and the generated model 300, as depicted in FIG. 7. In addition, ME 200 may maintain information related to (1) the generation of the models 300, 400 and (2) the changes to models 300, 400, as described above. (blocks 1110 through 1135).

Now suppose that ME 200 receives a request, from the user, to undo the above changes made to the referenced model 400 (block 1140). ME 200 may undo the changes made to the referenced model 400 based on the change information that was maintained for these changes (block 1145). Specifically, ME 200 may examine lines 626 through 633 of information 610 and identify that inport block 412a, gain block 414a, outport block 416a, and connections 418a-b have been removed from referenced model 400. ME 200 may undo the changes by recreating blocks 412a, 414a, and 416a and remaking connections 418a-b to the recreated blocks. ME 200 may then maintain these changes in information 610 (block 1150). Specifically, ME 200 may add lines to information 610 similar to lines 611-613, 615, 618, 619, 620, 623, and 625 to indicate that blocks 412a, 414a, and 416a have been added to the referenced model 400 and connections 418a-b have been restored. Moreover, the version of referenced model 400 may be indicated by ME 200 as version "2".

ME 200 may also undo the above changes made to model 300 (block 1155). Specifically, ME 200 may examine lines 666 and 667 in information 650 and determine that connections 312a-b had been removed from model 300. ME 200 may undo the changes by restoring connections 312a-b. ME 200 may then maintain these changes in information 650 (block 1160). Specifically, ME 200 may add lines similar to lines 651, 652, 658, 659, 662, and 663 to information 650. Also in information 650, the version number of model 300 may be indicated as version "2" and the last known version of referenced model 400 may be indicated as version "2".

Figure 12:
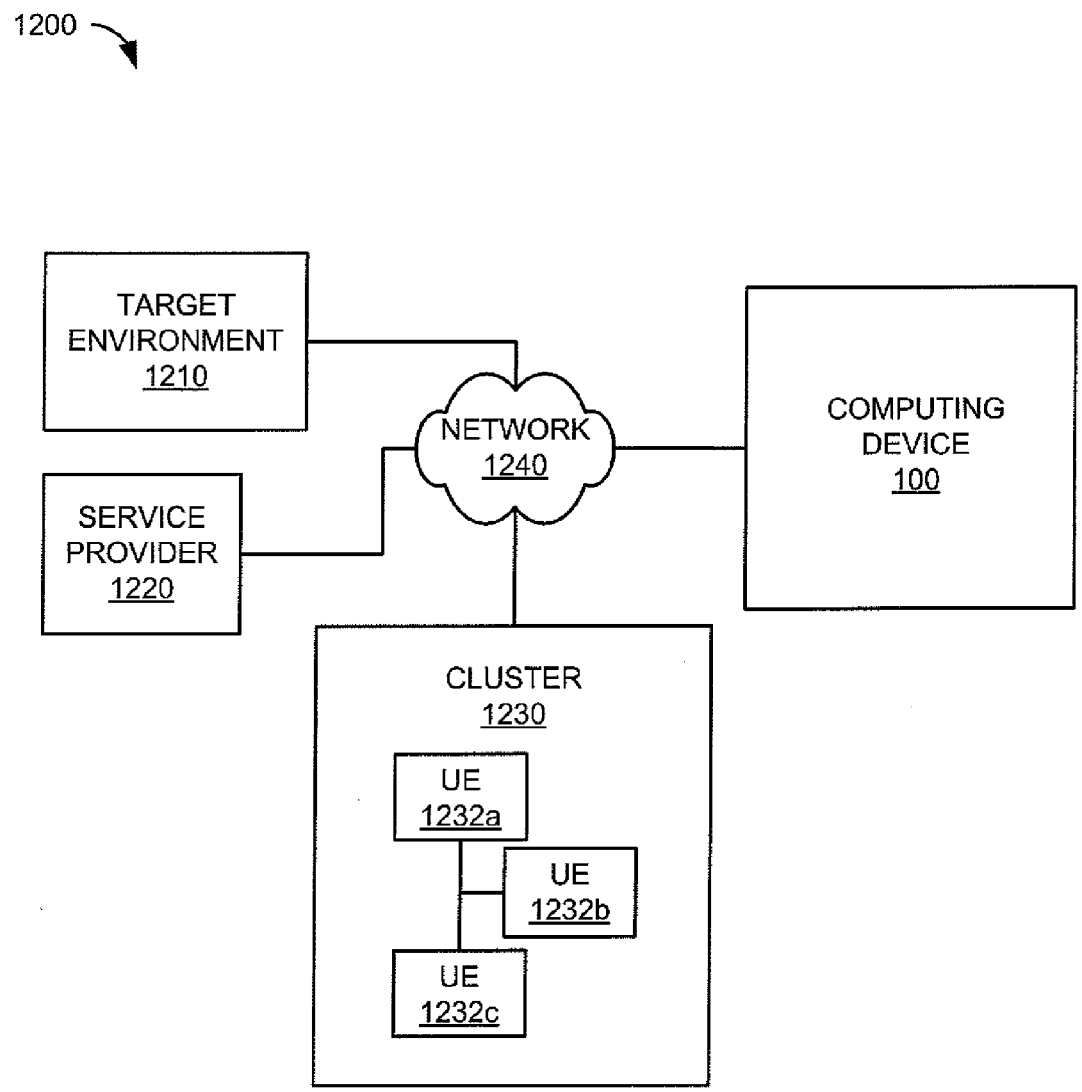
FIG. 12 illustrates an example of a distributed environment that may be configured to implement one or more embodiments of the invention.

One or more embodiments of the invention may be implemented in a distributed environment. FIG. 12 illustrates an example of a distributed environment 1200 that may be configured to implement one or more embodiments of the invention. Referring to FIG. 12, environment 1200 may contain various entities including computing device 100, target environment 1210, service provider 1220, cluster 1230, and network 1240. Note that the distributed environment 1200 is just one example of a distributed environment that may be used with embodiments of the invention. Other distributed environments that may be used with embodiments of the invention may contain more entities, fewer entities, entities in arrangements that differ from the arrangement illustrated in FIG. 12, and so on. Moreover, the distributed environments may be configured to implement various "cloud computing" frameworks, configuration management systems, and so on.

Details of computing device 100 were described above with respect to FIG. 1. In distributed environment 1200, computing device 100 may be configured to, among other things, exchange information (e.g., data) with other entities in network 1240 (e.g., target environment 1210, service provider 1220, and cluster 1230). Computing device 100 may interface with the network 1240 via communication interface 180.

Target environment 1210 may be configured to execute and/or interpret a compiled version of a model, such as model 300, which may be generated in or otherwise available to the distributed environment 1200. The network 1240 may include a communication network capable of exchanging information between the entities in the network 1240. The network 1240 may include digital and/or analog aspects. The information may include machine-readable information having a format that may be adapted for use, for example, in the network 1240 and/or with one or more entities in the network 1240. For example, the information may be encapsulated in one or more packets that may be used to transfer the information through the network 1240.

Information may be exchanged between entities using various network protocols, such as, but not limited to, the Internet Protocol (IP), Asynchronous Transfer Mode (ATM), Synchronous Optical Network (SONET), the User Datagram Protocol (UDP), Transmission Control Protocol (TCP), Institute of Electrical and Electronics Engineers (IEEE) 802.11, etc.

The network 1240 may comprise various network devices, such as gateways, routers, switches, firewalls, servers, repeaters, address translators, etc. Portions of the network 1240 may be wired (e.g., using wired conductors, optical fibers) and/or wireless (e.g., using free-space optical (FSO), radio frequency (RF), acoustic transmission paths). Portions of network 1240 may include a substantially open public network, such as the Internet. Portions of the network 1240 may include a more restricted network, such as a private corporate network or virtual private network (VPN). It should be noted that implementations of networks and/or devices operating on networks described herein are not limited with regards to, for example, information carried by the networks, protocols used in the networks, and/or the architecture/configuration of the networks.

The service provider 1220 may include logic that makes a service available to another entity in the distributed environment 1200. The service provider 1220 may also include a server operated by, for example, an individual, a corporation, an educational institution, a government agency, and so on, that provides one or more services to a destination, such as computing device 100. The services may include software containing computer-executable instructions that implement one or more embodiments of the invention or portions thereof, and may be executed, in whole or in part, by (1) a destination, (2) the service provider 1220 on behalf of the destination, or (3) some combination thereof.

For example, in an embodiment, service provider 1220 may provide one or more subscription-based services that may be available to various customers. The services may be accessed by a customer via network 1240. The customer may access the services using a computer system, such as computing device 100. The services may include services that implement one or more embodiments of the invention or portions thereof. The service provider 1220 may limit access to certain services based on, e.g., a customer service agreement between the customer and the service provider 1220.

The service agreement may allow the customer to access the services that may allow the customer to build, execute, and/or analyze a model, such as model 300, as described above. The service agreement may include other types of arrangements, such as certain fee-based arrangements or restricted access arrangements. For example, a customer may pay a fee which provides the customer unlimited access to a given package of services for a given time period (e.g., per minute, hourly, daily, monthly, yearly). For services not included in the package, the customer may have to pay an additional fee in order to access the services. Still other arrangements may be resource-usage based. For example, the customer may be assessed a fee based on an amount of computing resources and/or network bandwidth used.

Cluster 1230 may include a number of units of execution (UEs) 1232 that may perform processing of one or more embodiments of the invention or portions thereof on behalf of computing device 100 and/or another entity, such as service provider 1220. The UEs 1232 may reside on a single device or chip or on multiple devices or chips. For example, the UEs 1232 may be implemented in a single ASIC or in multiple ASICs. Likewise, the UEs 1232 may be implemented in a single computer system or multiple computer systems. Other examples of UEs 1232 may include FPGAs, CPLDs, ASIPs, processors, multiprocessor systems-on-chip (MPSoCs), graphic processing units, microprocessors, etc.

The UEs 1232 may be configured to perform operations on behalf of another entity. For example, in an embodiment, the UEs 1232 are configured to execute portions of code associated with the ME 200. Here, the ME 200 may dispatch certain activities pertaining to one or more embodiments of the invention to the UEs 1232 for execution. The service provider 1220 may configure cluster 1230 to provide, for example, the above-described services to computing device 100 on a subscription basis (e.g., via a web service).

The foregoing description of embodiments is intended to provide illustration and description, but is not intended to be exhaustive or to limit the invention to the precise form disclosed. Modifications and variations are possible in light of the above teachings or may be acquired from practice of the invention. For example, while a series of acts has been described above with respect to FIGS. 10 and 11A-B, the order of the acts may be modified in other implementations. Further, non-dependent acts may be performed in parallel.

Also, the term "user", as used herein, is intended to be broadly interpreted to include, for example, a computing device (e.g., a workstation) or a user of a computing device, unless otherwise stated.

It will be apparent that one or more embodiments, described herein, may be implemented in many different forms of software and hardware. Software code and/or specialized hardware used to implement embodiments described herein is not limiting of the invention. Thus, the operation and behavior of embodiments were described without reference to the specific software code and/or specialized hardware—it being understood that one would be able to design software and/or hardware to implement the embodiments based on the description herein.

Further, certain embodiments of the invention may be implemented as "logic" that performs one or more functions. This logic may be hardware-based, software-based, or a combination of hardware-based and software-based. The logic may be stored in one or more tangible computer-readable storage media and may include computer-executable instructions that may be executed by processing logic, such as processing logic 120. The computer-executable instructions may be configured to implement one or more embodiments of the invention. The tangible computer-readable storage media may be volatile or non-volatile and may include, for example, flash memories, removable disks, non-removable disks, and so on.

No element, act, or instruction used herein should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. One or more non-transitory computer-readable storage media to store instructions, the instructions comprising:
   one or more instructions that when executed by processing logic of a computer, cause the processing logic to:
   identify one or more changes to a first executable model, the first executable model including:
   a first operation, and
   a first connection to receive a first input to the first operation or to provide a first output from the first operation,
   the one or more changes to the first executable model including a change to at least one of the first operation, the first connection, the first input, or the first output;
   maintain first change information about the one or more changes to the first executable model,
   the first change information including data identifying the change to the at least one of the first operation, the first connection, the first input, or the first output;
   process a second executable model that references the first executable model,
   the second executable model including:
   a second operation, and
   a second connection to receive a second input to the second operation or to provide a second output from the second operation, and
   the one or more instructions to process the second executable model including:
   one or more instructions that, when executed by the processing logic, cause the processing logic to make one or more changes to the second executable model based on the first change information,
   the one or more changes to the second executable model including a change to at least one of the second operation, the second connection, the second input, or the second output;

maintain second change information identifying the one or more changes to the second executable model;
receive, after processing the second executable model, a request to undo a change of the one or more changes to the first executable model;
undo, based on the request, the change to the first executable model using the first change information; and
undo, using the second change information, a change, of the one or more changes to the second executable model, based on undoing the change to the first executable model.

2. The one or more non-transitory computer-readable media of claim 1, where the instructions further comprise:
one or more instructions that, when executed by the processing logic, further cause the processing logic to maintain version information about the first executable model,
the version information indicating a difference between a first version of the first executable model and a second version of the first executable model,
the one or more changes to the first executable model being identified based on the version information.

3. The one or more non-transitory computer-readable media of claim 2, where the one or more instructions to identify the one or more changes to the first executable model include:
one or more instructions that, when executed by the processing logic, cause the processing logic to identify the one or more changes to the first executable model based on comparing, using the version information, the first version of the first executable model and the second version of the first executable model.

4. The one or more non-transitory computer-readable media of claim 1, where the first executable model further includes a configurable subsystem, and
where the one or more instructions to make the one or more changes to the second executable model include:
one or more instructions that, when executed by the processing logic, causes the processing logic to make the one or more changes to the second executable model further based on a configuration of the configurable subsystem.

5. The one or more non-transitory computer-readable media of claim 4, where the configurable subsystem is associated with code, and
where the one or more instructions to make the one or more changes to the second executable model include:
one or more instructions that, when executed by the processing logic, cause the processing logic to make the one or more changes to the second executable model further based on the code.

6. The one or more non-transitory computer-readable media of claim 1, where at least one of the first executable model or the second executable model is a graphical model.

7. The one or more non-transitory computer-readable media of claim 1, where the first change information is associated with code,
where the one or more instructions to make the one or more changes to the second executable model include:
one or more instructions that, when executed by the processing logic, causes the processing logic to make the one or more changes to the second executable model further based on the code.

8. The one or more non-transitory computer-readable media of claim 1, where at least one of the first executable model or the second executable model is a textual model.

9. A method comprising:
identifying one or more changes to a first executable model,
the first executable model including:
a first operation, and
a first connection to receive a first input to the first operation or to provide a first output from the first operation,
the one or more changes to the first executable model including a change to at least one of the first operation, the first connection, the first input, or the first output, and
the identifying being performed by a computing device;
maintaining first change information identifying the one or more changes to the first executable model,
the first change information including data identifying the change to the at least one of the first operation, the first connection, the first input, or the first output, and
the maintaining the first change information being performed by the computing device;
processing a second executable model that references the first executable model,
the second executable model including:
a second operation, and
a second connection to receive a second input to the second operation or to provide a second output from the second operation,
the processing the second executable model including:
making one or more changes to the second executable model based on the first information,
the one or more changes to the second executable model including a change to at least one of the second operation, the second connection, the second input, or the second output, and
the processing being performed by the computing device;
maintaining second change information identifying the one or more changes to the second executable model,
the maintaining the second change information being performed by the computing device;
receiving, after processing the second executable model, a request to undo a change of the one or more changes to the first executable model,
the receiving being performed by the computing device;
undoing, based on the request, the change to the first executable model using the first change information,
the undoing the change to the first executable model being performed by the computing device; and
undoing, using the second change information, a change, of the one or more changes to the second executable model, based on undoing the change to the first executable model,
the undoing the change to the second executable model being performed by the computing device.

10. The method of claim 9, further comprising:
maintaining version information about the first executable model,
the version information indicating a difference between a first version of the first executable model and a second version of the first executable model,
where identifying the one or more changes to the first executable model includes:
identifying the one or more changes to the first executable model based on the difference between the first version of the first executable model and the second version of the first executable model.

11. The method of claim 9, where the first executable model further includes a configurable subsystem, and
where making the one or more changes to the second executable model includes:
making the one or more changes to the second executable model based on a configuration of the configurable subsystem.

12. The method of claim 11, where the configurable subsystem is associated with code, and
where making the one or more changes to the second executable model includes:
making the one or more changes to the second executable model further based on the code.

13. The method of claim 9, where the first change information is associated with code, and
where making the one or more changes to the second executable model includes:
making, further based on the code, the one or more changes to the second executable model.

14. A system comprising:
memory; and
processing logic to:
identify one or more changes to a first executable model,
the first executable model including:
a first operation, and
a first connection to receive a first input to the first operation or to provide a first output from the first operation, and
the one or more changes to the first executable model including a change to at least one of the first operation, the first connection, the first input, or the first output,
maintain, in the memory, first change information identifying the one or more changes to the first executable model,
the first change information including data identifying the change to the at least one of the first operation, the first connection, the first input, or the first output,
process a second executable model that references the first executable model,
the second executable model including:
a second operation, and
a second connection to receive a second input to the second operation or to provide a second output from the second operation, and
the processing logic, when processing the second executable model, being further to:
make one or more changes to the second executable model based on the first change information,
the one or more changes to the second executable model including a change to at least one of the second operation, the second connection, the second operation, or the second output,
maintain, in the memory, second change information identifying the one or more changes to the second executable model,
receive, after processing the second executable model, a request to undo a change of the one or more changes to the first executable model,
undo, based on the request, the change to the first executable model using the first change information, and
undo, using the second change information, a change, of the one or more changes to the second executable model, based on undoing the change to the first executable model.

15. An apparatus comprising:
means for identifying one or more changes to a first executable model,
the first executable model including:
a first operation, and
a first connection to receive a first input to the first operation or to provide a first output from the first operation, and
the one or more changes to the first executable model including a change to at least one of the first operation, the first connection, the first input, or the first output;
means for maintaining first change information about the one or more changes to the first executable model,
the first change information including data identifying the change to the at least one of the first operation, the first connection, the first input, or the first output;
means for processing a second executable model that references the first executable model,
the second executable model including:
a second operation, and
a second connection to receive a second input to the second operation or to provide a second output from the second operation, and
the means for processing the second executable model including:
means for making one or more changes to the second executable model, based on the first change information,
the one or more changes to the second executable model including a change to at least one of the second operation, the second connection, the second input, or the second output;
means for maintaining second change information identifying the one or more changes to the second executable model;
means for receiving, after processing the second executable model, a request to undo a change of the one or more changes to the first executable model;
means for undoing, based on the request, the change to the first executable model using the first change information; and
means for undoing, using the second change information, a change, of the one or more changes to the second executable model, based on undoing the change to the first executable model.

16. The method of claim 9, where each of the first executable model and the second executable model is:
a graphical model, or
a textual model.

17. The system of claim 14, where the processing logic is further to:
maintain version information about the first executable model,
the version information indicating differences between a first version of the first executable model and a second version of the first executable model, and
where the processing logic, when identifying the one or more changes to the first executable model, is further to:
identify the one or more changes to the first executable model further based on a difference between the first version of the first executable model and the second version of the first executable model.

18. The system of claim 14, where the first executable model further includes a configurable subsystem, and
where the processing logic, when making the one or more changes to the second executable model, is further to:

make the one or more changes to the second executable model further based on a configuration of the configurable subsystem.

19. The system of claim 18, where the configurable subsystem is associated with code, and
where the processing logic, when making the one or more changes to the second executable model, is further to:
make the one or more changes to the second executable model further based on the code.

20. The system of claim 14, where the first change information is associated with code,
where the processing logic, when making the one or more changes to the second executable model, is further to:
make the one or more changes to the second executable model further based on the code.

21. The system of claim 14, where at least one of the first executable model or the second executable model is a textual model.

22. The system of claim 14, where at least one of the first executable model or the second executable model is a graphical model.

\* \* \* \* \*